United States Patent
Koo (10) Patent No.: US 7,494,917 B2
(45) Date of Patent: Feb. 24, 2009

(54) METHOD FOR FORMING AN ELECTRICAL INTERCONNECTION PROVIDING IMPROVED SURFACE MORPHOLOGY OF TUNGSTEN

(75) Inventor: Kyung-Bum Koo, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 11/028,348

(22) Filed: Jan. 3, 2005

(65) Prior Publication Data

US 2005/0118806 A1 Jun. 2, 2005

Related U.S. Application Data

(60) Division of application No. 10/385,077, filed on Mar. 10, 2003, now Pat. No. 6,908,848, which is a continuation-in-part of application No. 09/859,823, filed on May 17, 2001, now abandoned.

(30) Foreign Application Priority Data

Dec. 20, 2000 (KR) .................................. 00-78998

(51) Int. Cl.
*H01L 21/4763* (2006.01)
(52) U.S. Cl. ....................... 438/627; 438/629; 438/653
(58) Field of Classification Search ................ 438/627, 438/652, 629, 653, 633
See application file for complete search history.

(56) References Cited

U.S. PATENT DOCUMENTS

| 5,272,112 A | 12/1993 | Schmitz et al. ............. 437/192 |
| 5,286,675 A | 2/1994 | Chen et al. .................. 437/195 |
| 5,407,698 A * | 4/1995 | Emesh ........................ 438/199 |
| 5,451,551 A | 9/1995 | Krishnan et al. ............ 437/241 |
| 6,028,362 A | 2/2000 | Omura ........................ 257/774 |
| 6,030,893 A | 2/2000 | Lo et al. ..................... 438/652 |
| 6,136,690 A | 10/2000 | Li ............................... 438/627 |
| 6,245,657 B1 | 6/2001 | Chu et al. ................... 438/618 |
| 6,271,129 B1 * | 8/2001 | Ghanayem et al. ......... 438/675 |
| 6,309,713 B1 | 10/2001 | Mak et al. ................... 427/569 |

OTHER PUBLICATIONS

Wolf, S., "Silicon Processing for the VLSI Era," vol. 2, Lattice Press, Sunset Beach, California, 1990, p. 202.

* cited by examiner

*Primary Examiner*—Michael Trinh
(74) *Attorney, Agent, or Firm*—Mills & Onello, LLP (57) ABSTRACT

In a fabrication method for forming an electrical interconnection of CVD tungsten film, a contact hole is formed in a dielectric layer. A lower conductive layer is formed in the contact hole and over the dielectric layer. A portion of the lower conductive layer is removed. As a result, the dielectric layer is exposed. An upper conductive layer is formed over the lower conductive layer and over the dielectric layer. The lower conductive layer has a rough surface and the upper conductive layer has a smooth surface. In this manner, following patterning of conductive stripes over the conductive layer, residue is mitigated, and thus, inadvertent interconnection of neighboring stripes is eliminated.

7 Claims, 9 Drawing Sheets

Fig. 1

(Prior Art)

Fig. 2

(Prior Art)

METHOD FOR FORMING AN ELECTRICAL INTERCONNECTION PROVIDING IMPROVED SURFACE MORPHOLOGY OF TUNGSTEN

RELATED APPLICATIONS

This application is a divisional application of Ser. No. 10,385,077, filed Mar. 10, 2003, now U.S. Pat. No. 6,908,848, which is a continuation-in-part application of U.S. Ser. No. 09/859,823, filed May 17, 2001, now abandoned, which relies for priority upon Korean Patent Application No. 2000-78998, filed on Dec. 20, 2000, the contents of each being herein incorporated by reference in its entirety.

FIELD OF THE INVENTION

The invention relates to methods for the fabrication of semiconductor devices and more particularly to methods for forming an electrical interconnection of CVD tungsten film.

BACKGROUND OF THE INVENTION

Fabrication of semiconductor devices generally involves a procedure of forming thin films and layers of various materials on wafers of base semiconductor materials, and removing selected areas of such films to provide structures and circuitry. Tungsten is one of the materials commonly deposited on wafers during fabrication. Tungsten provides many advantageous features that render it especially amenable for forming electrical interconnections including plugs and interconnecting stripes. In this capacity, tungsten film is deposited into contact holes, and etched or polished to an intermediate insulating layer, leaving tungsten plugs remaining in the contact holes. Where the interconnecting stripes are desired, the deposited tungsten film is patterned with photoresist and anisotropically etched, leaving the interconnecting stripes over the insulating layer.

Chemical vapor deposition (CVD) is a well-known process for depositing the tungsten films. In a typical CVD process for forming the tungsten films, wafers are placed on supports within a sealable chamber, the chamber is sealed and evacuated, the wafers are heated, and a gas mixture is introduced into the chamber. A source gas comprising tungsten hexafluoride ($WF_6$) is subjected to reduction by hydrogen gas, silane ($SiH_4$) gas or a mixture of hydrogen and silane. Typically the gases flow continuously during the process. Temperature of the substrate (wafer) to be coated is one of variables that drive the chemical reaction to cause tungsten to be deposited on the substrate surface. It is important to control the temperature and the concentration of the gases in the mixture introduced in the tungsten CVD process.

According to a number of studies, while low tensile stress films are promoted by a relatively lower flow rate of $WF_6$ and relatively higher wafer temperature, step coverage is promoted by a relatively higher flow rate of $WF_6$ and relatively lower wafer temperature. High tensile stress of a film induces distortion of the wafer on which the film is deposited. This distortion of the wafer makes an adjustment of focus extremely difficult during a photo process to be performed after the deposition of the film. The step coverage is a measure of how well a deposited layer maintains its nominal thickness as it crosses a step. This measure is illustrated in Wolf, S., "Silicon Processing for the VLSI Era", Vol.2, Lattice Press, Sunset Beach, Calif., (1990), p.202.

Low tensile stress films are known to be quite important for interconnecting stripe applications, but tensile stress is not as critical for plug applications. Similarly, good step coverage is desirable for plug applications, but relatively less critical for interconnecting stripe applications. Because of the different requirements for tungsten film characteristics and the dependence on process parameters as described above, the optimization of process for both plug and interconnecting stripe application was very difficult. A number of approaches to address this issue in the optimization of tungsten CVD process have been reported, including U.S. Pat. No. 5,272,112 to Johannes J. Schmitz et al. and U.S. Pat. No. 6,030,893 to Yung-Tsun Lo et al.

Figure 1:
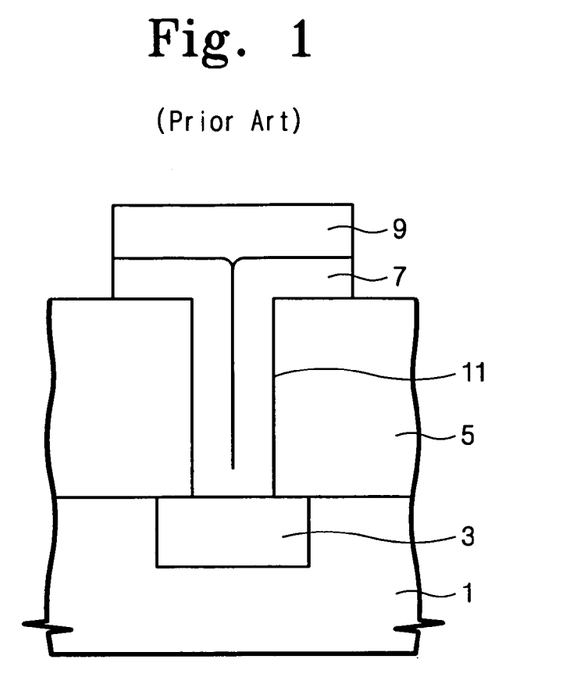
FIG. 1 is a cross sectional schematic view illustrating a process for forming an electrical interconnection according to a prior art configuration.
Figure 2:
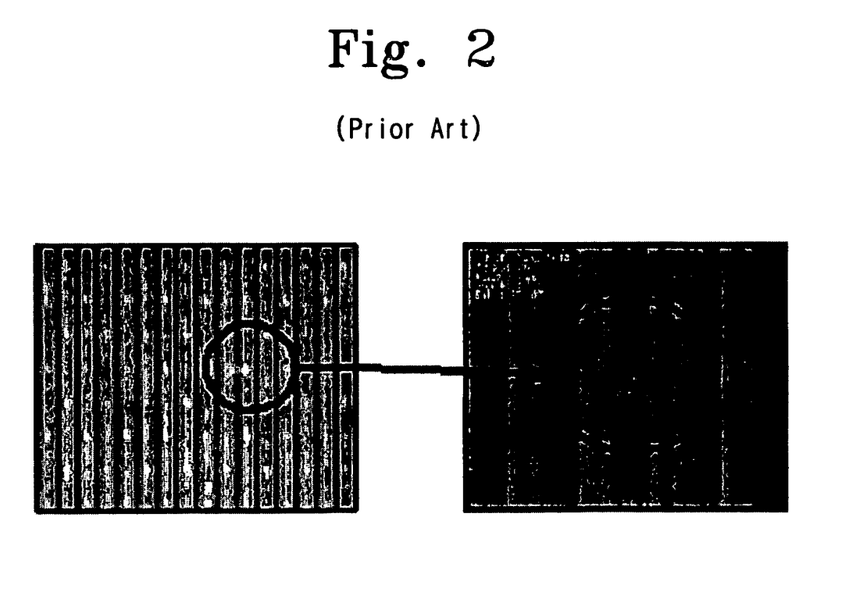
FIG. 2 is a scanning electron microscope (SEM) view illustrating undesired electrical connection between the interconnecting stripes in the process for forming the electrical interconnection according to the prior art.

FIGS. 1 and 2 are a cross sectional schematic view and a scanning electron microscope (SEM) view respectively illustrating a process for forming an electrical interconnection in a semiconductor device according to a prior art disclosed in the '893 Lo et al. patent.

Referring to FIG. 1, a conductive region 3 is formed in a substrate 1. A dielectric layer 5 is then deposited on the substrate 1 and the conductive region 3. The dielectric layer 3 is etched to form a contact hole 11 exposing the conductive region. After that, the wafer is sent into a first chamber to form a lower conductive layer 7 on the dielectric layer 5 and in the contact hole 11 to contact the conductive region 3. The lower conductive layer 7 is a CVD tungsten film, which has the properties of high tensile stress and suitable step coverage. Thereafter, the wafer is sent into a second chamber to form an upper conductive layer 9 on the lower conductive layer 5. The upper conductive layer 9 is a CVD tungsten film, which has the properties of low tensile stress and moderate step coverage. The combination of the two tungsten layers is patterned with photoresist and anisotropically etched, leaving an interconnecting stripe over the dielectric layer.

However, according to the prior art, the anisotropic etching procedure is unable to entirely remove the combination of the two tungsten layers, leaving residue on the dielectric layer. The residue may cause undesired electrical connection between the interconnecting stripes. FIG. 2 shows an example of an undesired electrical connection between adjacent stripes.

SUMMARY OF THE INVENTION

It is therefore an object of the present invention to provide a method for forming an electrical interconnection that confers the advantageous property of good step coverage in contact holes and low tensile stress in interconnecting stripes, while mitigating, or eliminating, undesirable electrical connection between the interconnecting stripes.

The method comprises forming a dielectric layer over a substrate. A contact hole is formed in the dielectric layer. A lower conductive layer is then formed in the contact hole and over the dielectric layer. A portion of the lower conductive layer is removed to leave a plug in the contact hole. An upper conductive layer is formed over the plug and over the dielectric layer. The upper conductive layer is patterned to form a interconnecting stripe. A surface roughness of the lower conductive layer is preferably greater than that of the upper conductive layer. Step coverage of the lower conductive layer is preferably better than that of the upper conductive layer. A tensile stress of the lower conductive layer is preferably higher than that of the upper conductive layer.

In another aspect, the present invention is directed to a method for fabricating a semiconductor device. A dielectric layer is formed over a substrate. A contact hole is formed in the dielectric layer. A barrier layer is formed in the contact hole and on a surface of the dielectric layer. A lower conductive layer is formed on the barrier layer to fill the contact hole.

A portion of the lower conductive layer outside the contact hole is removed to leave a plug in the contact hole. An upper conductive layer is formed on the barrier layer and on the plug.

In still another aspect, the present invention is directed to a method for fabricating a semiconductor device. A dielectric layer is formed over a substrate. A contact hole is formed in the dielectric layer. A first barrier layer is formed in the contact hole and on a surface of the dielectric layer. A lower conductive layer is formed on the barrier layer to fill the contact hole. A portion of the lower conductive layer and the first barrier layer is polished to expose a surface of the dielectric layer and to leave a plug in the contact hole. A second barrier layer is formed on the surface of the dielectric layer and on the plug. An upper conductive layer is formed on the second barrier layer.

In yet another aspect, the present invention is directed to a method for fabricating a semiconductor device. A dielectric layer is formed over a substrate. A groove channel is formed in an upper portion of the dielectric layer. A contact hole penetrating the dielectric layer if formed below the groove channel. A barrier layer is formed in the groove channel, in the contact hole and on an upper surface of the dielectric layer. A lower conductive layer is formed on the barrier layer to fill the contact hole. An upper conductive layer is formed on the barrier layer and the lower conductive layer. The upper conductive layer and the barrier layer are polished to expose the upper surface of the dielectric layer.

Because the plug is formed of the lower conductive layer having the property of suitable step coverage, there is substantially no void in the contact hole. Furthermore, since the interconnecting stripe is formed of the upper conductive layer having the attractive property of a smooth surface, there is substantially no residue after the patterning for forming the conductive stripe and therefore accurate alignment in a photo process can be readily obtained.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

The present invention will now be described more fully hereinafter with reference to the accompanying drawings.

Figure 3A:
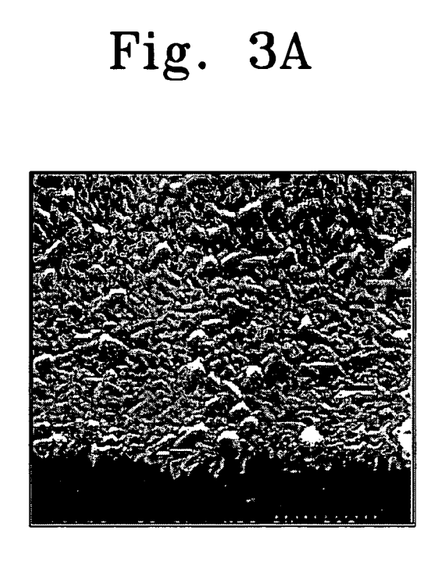
FIGS. 3A and 3B are SEM views illustrating dependency of surface morphology on process temperature.
Figure 3B:
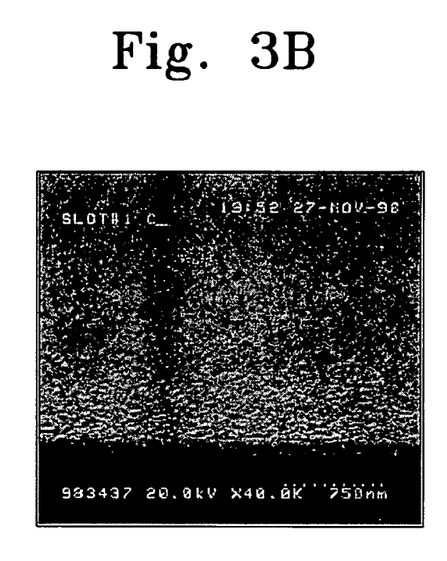

The present invention recognizes that process temperature and gas concentration are important variables that affect surface morphology as well as the properties of tensile stress and step coverage of the CVD tungsten film. In detail, smooth surface roughness is promoted by a relatively lower flow rate of $SiH_4$ and relatively higher wafer temperature during the tungsten deposition. FIGS. 3A and 3B show this dependency of surface morphology on process condition. FIG. 3A is a SEM view of a tungsten film which is formed at 365 C with a thickness of 800 Angstroms. FIG. 3B is a SEM view of a tungsten film which is formed at 415 C with a thickness of 800 Angstroms. The other process parameters are identical in the two tungsten films; namely, a total pressure of 40 Torr., $WF_6$ flow rate of 300 sccm, $SiH_4$ flow rate of 40 sccm and hydrogen flow rate of 9,000 sccm were used. $WF_6$ is subjected to reduction by a mixture of $SiH_4$ and hydrogen to deposit the tungsten films. As shown in the drawings, while the film of FIG. 3A has a rough surface, the film of FIG. 3B has a smooth surface. FIG. 3A and 3B are images which are magnified 40,000 times. In a similar experiment using the flow rate of $SiH_4$ as a variable, the present inventor obtained a result which demonstrates the dependency of morphology of tungsten film as described above. That is to say, smooth surface roughness is promoted by a relatively lower flow rate of $SiH_4$ during the tungsten deposition.

In view of this dependency of morphology of tungsten film, in the prior art method, it can be readily understood that the upper conductive layer has a smooth surface and the lower conductive layer has a rough surface. In addition, it was determined that the upper conductive layer of tungsten substantially replicates the surface roughness of the lower conductive layer in the prior art method. As a result, the combination of the two layers does not have a smooth surface, resulting in a number of adverse consequences. The residue problem discussed above is one of these problems. Furthermore, the irregular rough surface makes an adjustment of alignment extremely difficult during a photo process to be performed following the deposition of tungsten films.

FIGS. 4 to 9 are cross sectional schematic views illustrating a process for forming an electrical interconnection according to a first embodiment of the present invention and FIG. 10 is a cross sectional schematic view illustrating a modified embodiment thereof.

Figure 4:
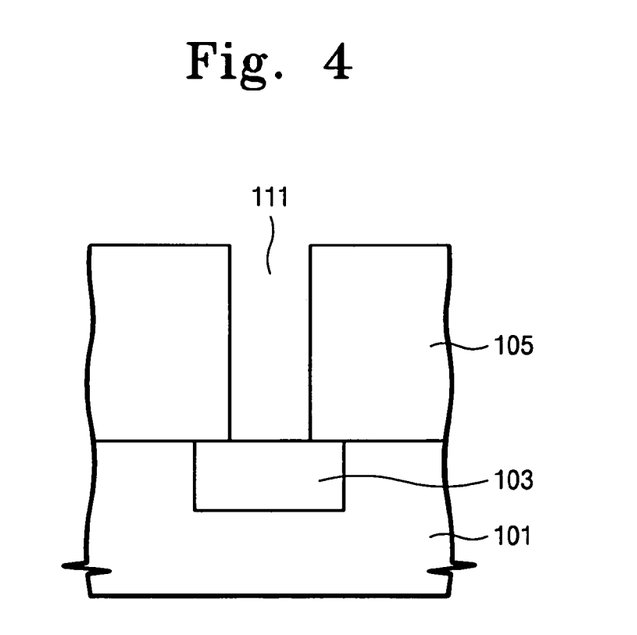
FIGS. 4 to 9 are cross sectional schematic views illustrating a process for forming an electrical interconnection according to a first embodiment of the present invention.

Referring to FIG. 4, there is shown a substrate 101, preferably composed of monocrystalline silicon. The substrate 101 has a conductive area 103 formed therein. The conductive area 103 is a impurity active region formed by ion implantation into the substrate 101. Other structures such as a polycrystalline silicon pattern, an aluminum wiring pattern, a metal plug or the like, though not shown, may be formed in and on the substrate 101.

A dielectric layer 105, composed of insulating material such as borophosphosilicate glass (BPSG), spin-on-glass (SOG) or the like, is deposited over the substrate 101 to a thickness of between about 2,000 to 15,000 Angstroms. A contact hole 111 is formed through the dielectric layer 105 to the substrate 101.

In a modified embodiment of this embodiment, prior to the formation of contact hole 111, a groove channel may be further formed. Referring to FIG. 10, The groove channel 113 is formed in the dielectric layer 105. After forming the groove channel 113, a contact hole 111 is formed through the insulating layer 105. The contact hole 111 may be formed in regions with or without groove channels 113.

Figure 5:
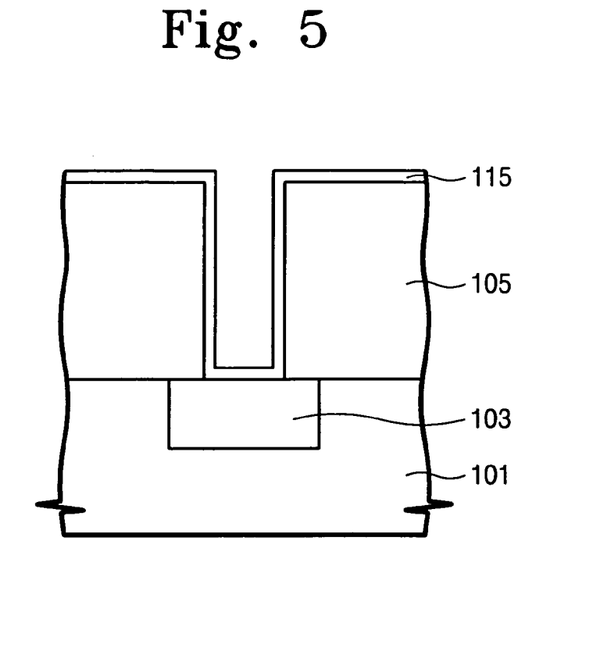

Referring to FIG. 5, a barrier layer 115 is deposited conformally over the dielectric layer 105 and within the contact hole 111. The barrier layer 115 is preferably formed of one selected from the group consisting of titanium, titanium nitride, tungsten silicide and combinations thereof. In this embodiment, the barrier layer 115 is formed of titanium nitride overlying titanium. This barrier layer 115 is deposited by sputtering or CVD to a thickness of between about 100 to 500 Angstroms. In the modified embodiment described above, the barrier layer 115 may be deposited within the groove channel 113 as well as over the dielectric layer 105 and within the contact hole 111.

Figure 6:
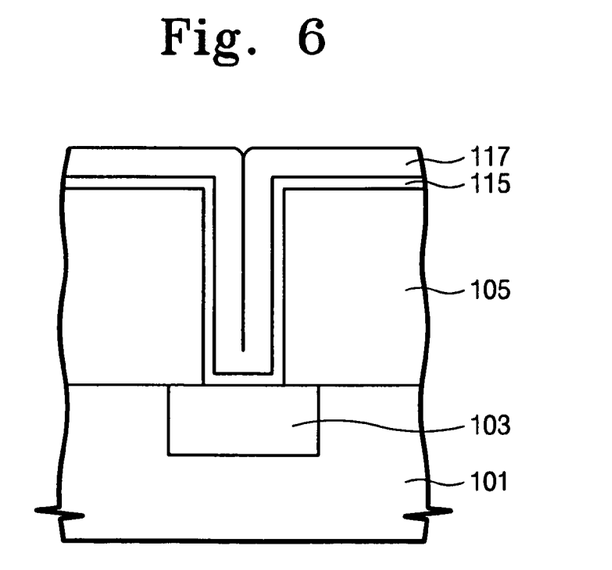
Figure 7:
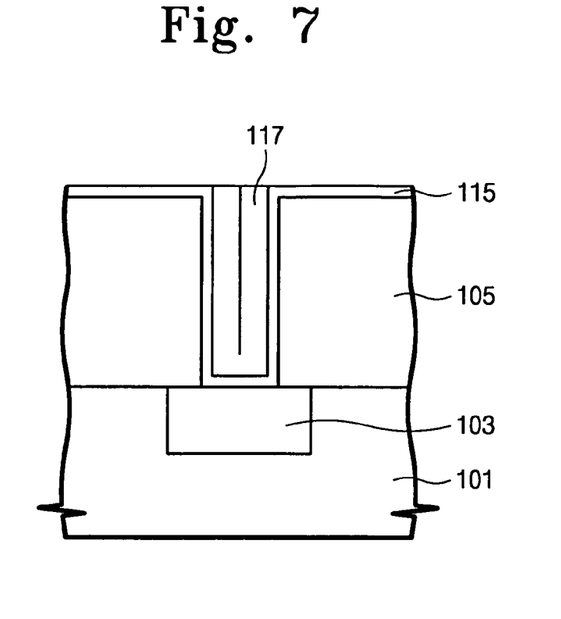
Figure 13A:
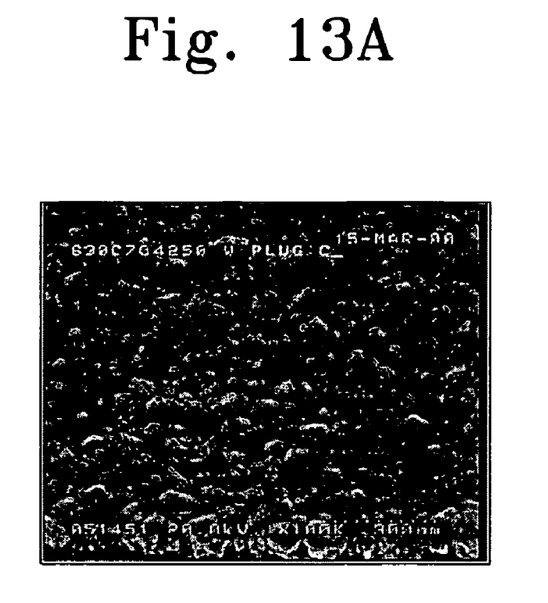
FIGS. 13A and 13B are SEM views illustrating surface morphology of tungsten films according to the first embodiment of the present invention.

Referring now to FIG. 6, a lower conductive layer 117 of tungsten is deposited over the substrate in a CVD chamber to a thickness of between about 400 to 5,000 Angstroms. In this embodiment, the thickness of the lower conductive layer is 800 Angstroms. The lower conductive layer 117 is formed, for example under a condition of a total pressure of about 40 Torr, and at a temperature of about 365 C using $WF_6$, $SiH_4$ and hydrogen. The flow rate of the $WF_6$, $SiH_4$ and hydrogen are 300 sccm, 40 sccm and 9,000 sccm respectively. The $WF_6$ gas is subjected to reduction by a mixture of $SiH_4$ and hydrogen. This lower conductive layer 117 of tungsten has a property of good step coverage and high tensile stress. The lower conductive layer 117 includes a rough surface, as shown in FIG. 13A The lower conductive layer 117 is etched back, leaving a tungsten plug filling the contact hole, as shown in FIG. 7. In other words, the rough lower conductive layer is removed except in the contact hole.

Figure 8:
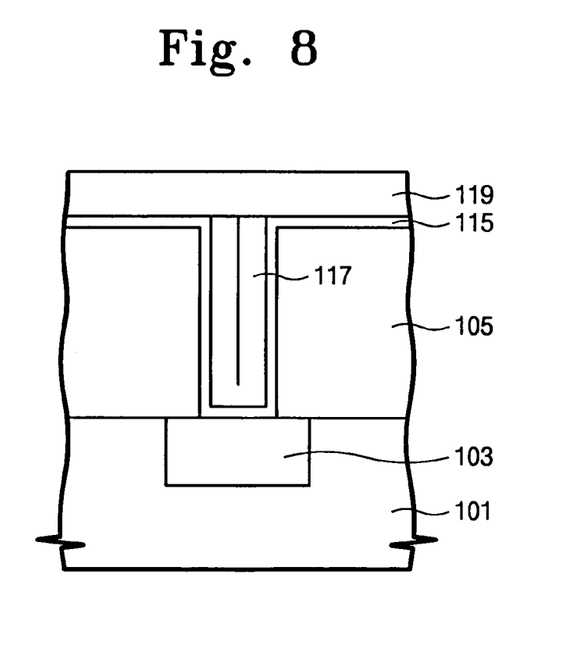
Figure 13B:
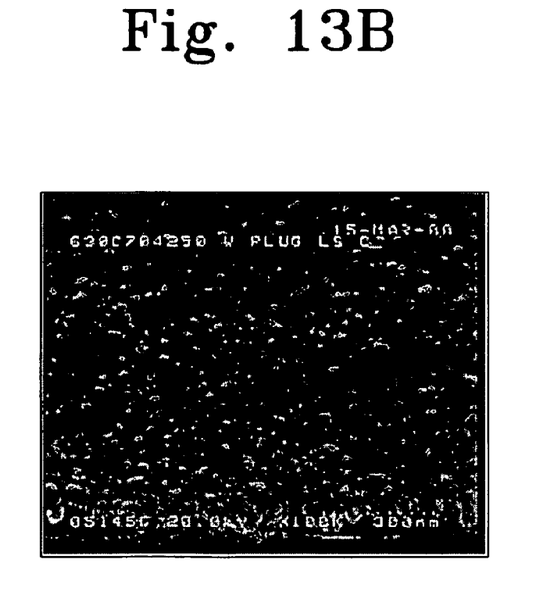

Referring to FIG. 8, an upper conductive layer 119 is deposited over the resultant structure of FIG. 7, using, for example, a CVD technique, to a thickness of between about 400 to 5,000 Angstroms. In this embodiment, the thickness of the upper conductive layer is 800 Angstroms. The upper conductive layer 119 is formed in condition of a total pressure of about 40 Torr, temperature of about 437° C. using $WF_6$, $SiH_4$ and hydrogen. Preferred flow rates of $WF_6$, $SiH_4$ and hydrogen are 200 sccm, 26 sccm and 9,000 sccm respectively. The $WF_6$ gas is subjected to reduction by a mixture of $SiH_4$ and hydrogen. The upper conductive layer 119 of tungsten has the properties of moderate step coverage and low tensile stress. Also, the upper conductive layer 119 shows a smooth surface, as shown in FIG. 13B. FIG. 13A and 13B are images which are magnified 100,000 times.

Unlike the prior art, the upper conductive layer may be formed in the CVD chamber in which the lower conductive layer is formed. In the present invention, there is an intervening process of etching back the lower conductive layer between formation of the lower conductive layer and formation of the upper conductive layer. Therefore, there is time for changing process parameter settings for the upper conductive layer. On the contrary, in the prior art, a process forming the upper conductive layer is performed immediately following formation of the lower conductive layer. Therefore, there is inadequate time for changing the process parameter settings following formation of the lower conductive layer.

The upper conductive layer 119 may be deposited by sputtering instead of CVD. It is well known that sputtering of tungsten provides a better surface morphology than that of CVD tungsten.

Figure 9:
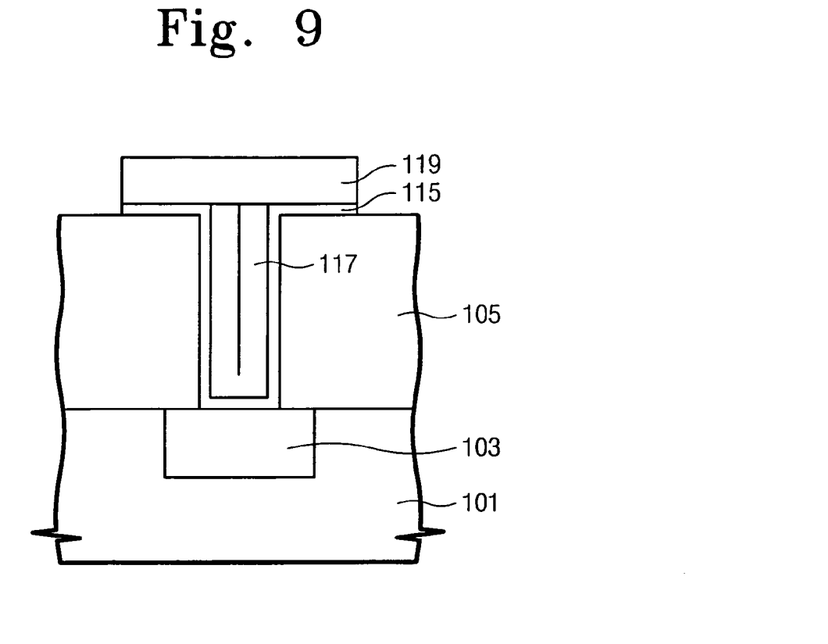

The combination of the upper conductive layer and the barrier layer is patterned using a photo/etching process, leaving interconnecting stripes over the dielectric layer 105 as shown in FIG. 9. In the modified embodiment described above, the combination of the upper conductive layer and the barrier layer may be subject to polishing such as CMP (chemical mechanical polishing) to the surface of the dielectric layer. As a result, the interconnecting stripes are retained to within the groove channel 113.

Figure 10A:
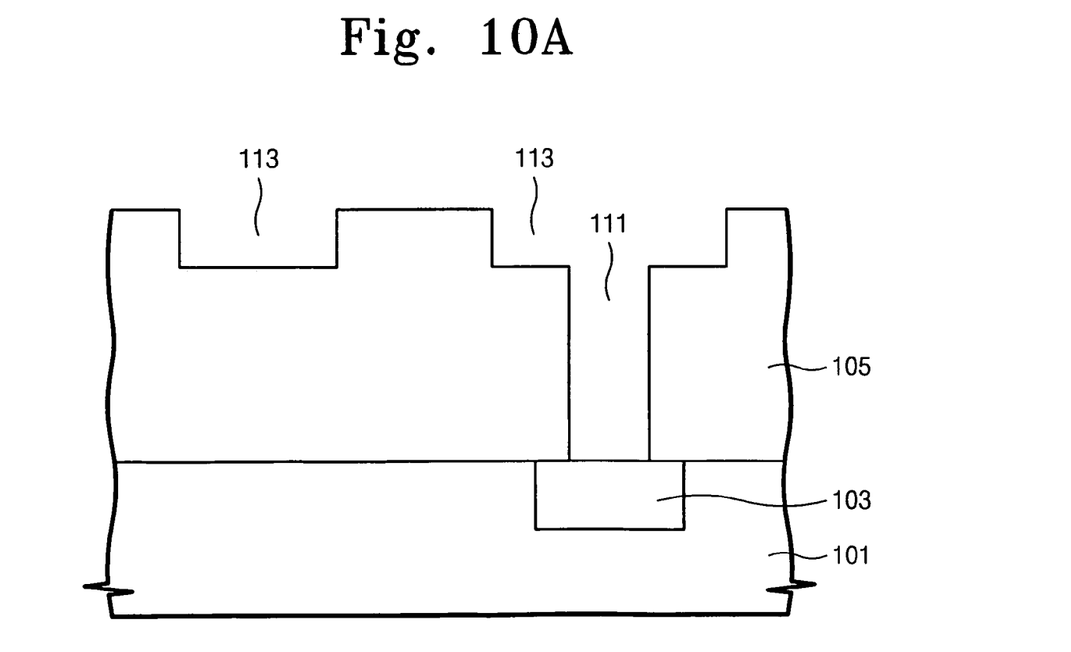
FIGS. 10A-10E are cross sectional schematic views illustrating a process for forming an electrical interconnection according to a modified embodiment of the first embodiment of the present invention.
Figure 10B:
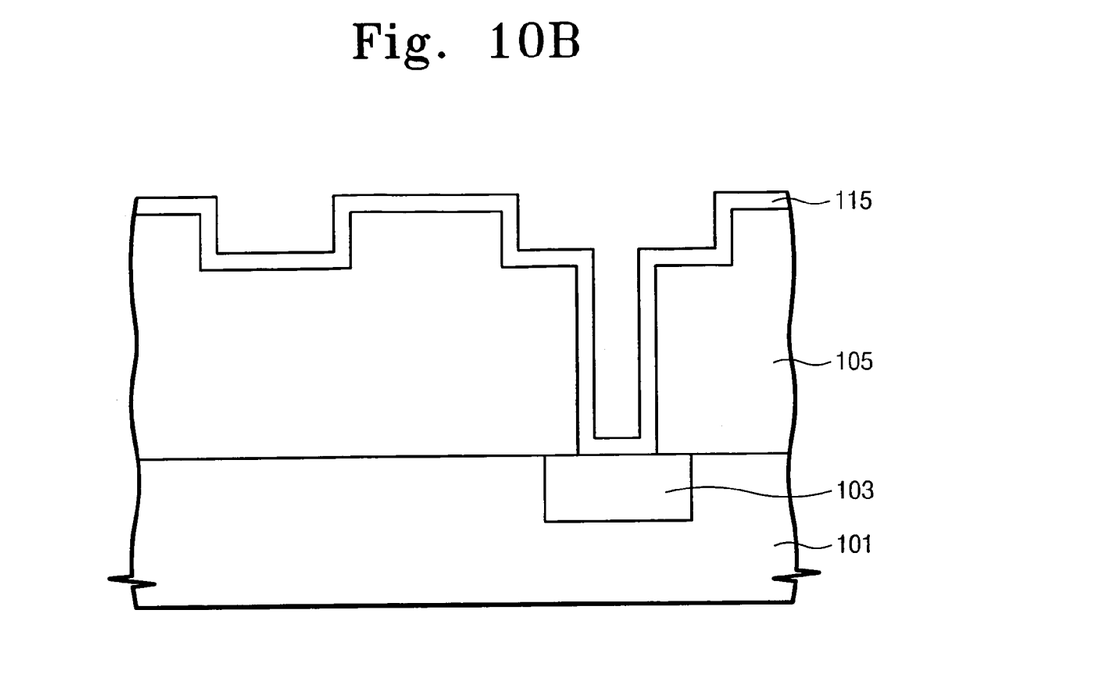
Figure 10C:
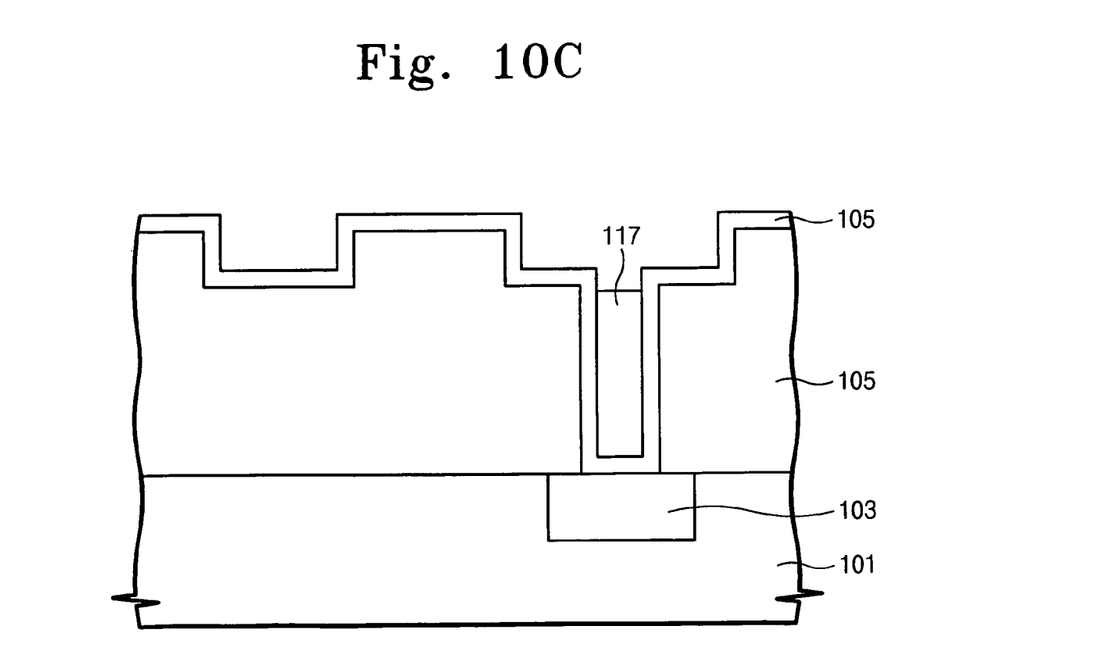
Figure 10D:
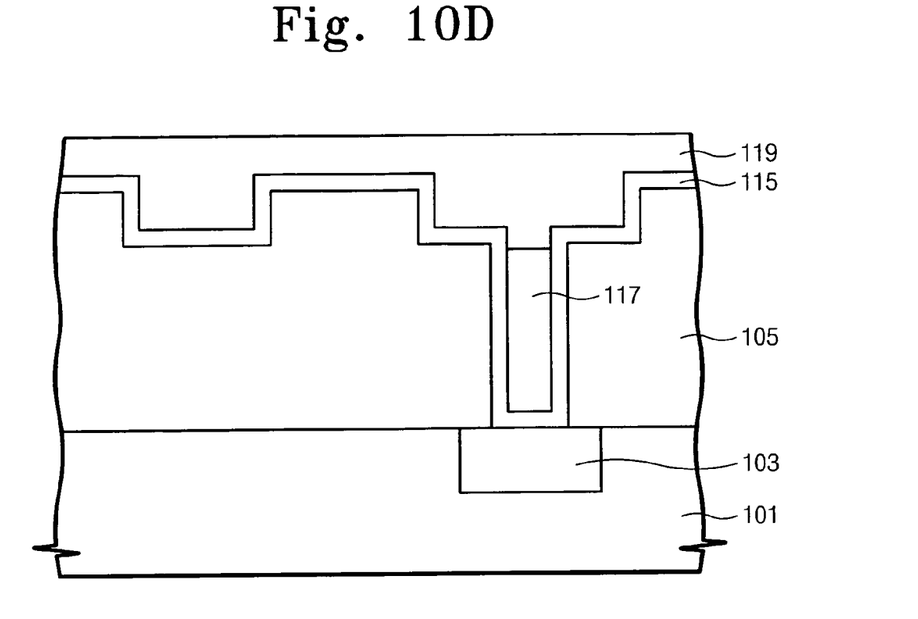
Figure 10E:
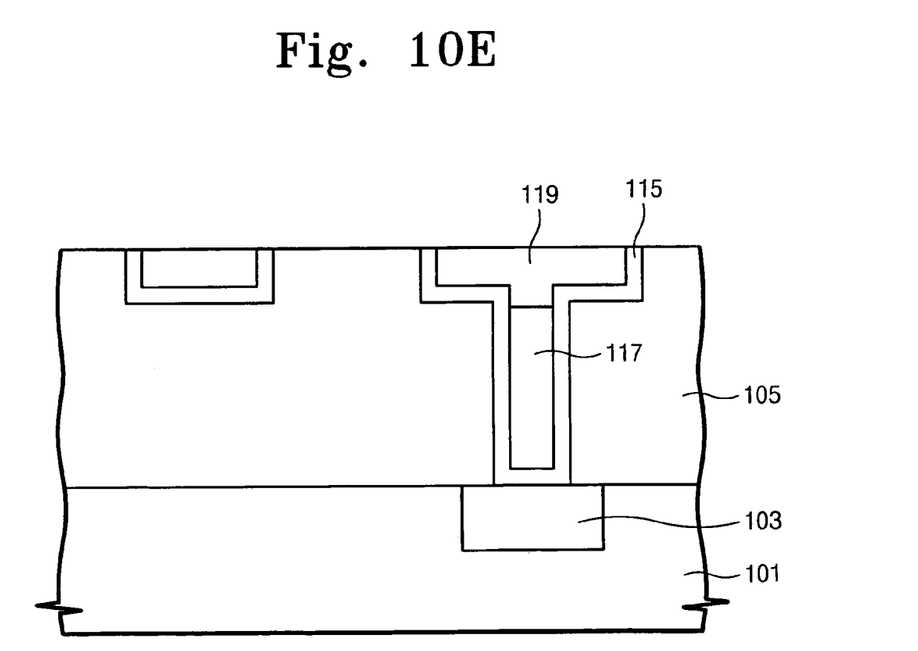

In the modified embodiment described above, referring to FIG. 10A, a stepped groove structure is formed in the dielectric layer 105. The stepped groove structure includes a groove channel 113 for an interconnection stripe and a contact hole 111 exposing the underlying conductive area 103. The stepped groove structure can be formed by patterning an upper portion of the dielectric layer 105 to form the groove channel 113, followed by patterning the dielectric layer 105 below the groove channel 113 to form the contact hole 111. Alternatively, the stepped groove structure can be formed by patterning the dielectric layer 105 to form the contact hole 111, followed by patterning the upper portion of the dielectric layer to form the groove channel 113. After forming the groove channel 113 and the contact hole 111 as shown in FIG. 10A, a barrier layer 115 is formed in the groove channel 113 and the contact hole 111 as shown in FIG. 10B. The barrier layer 115 is formed in the same manner as the technique described above with reference to FIG. 5. Next, a lower conductive layer is formed on the barrier layer 115 in the same manner as described above with reference to FIG. 6. A portion of the lower conductive layer outside the contact hole 111 is removed such that a conductive plug 117 remains in the hole, as shown in FIG. 10C. The removal of a portion of the lower conductive layer can be carried out by an etch back process, as described above with reference to FIG. 7. Referring to FIG. 10D, an upper conductive layer 119 is formed on the plug 117, in the groove channel 113 and on the barrier layer 115. The upper conductive layer 119 is formed in the same manner as that described above with reference to FIG. 8. Next, as shown in FIG. 10E, the upper conductive layer 119 is polished, for example, until a top surface of the dielectric layer 105 is exposed such that an interconnection stripe 119 remains in the groove channel 113. In other words, the interconnection stripe 119 is in direct contact with the barrier layer 115 except in the region of the plug 117 where the interconnection stripe 119 is in contact with the plug 117.

In this manner, according to the present invention, the upper conductive layer, for example the tungsten layer, the surface morphology of which depends on an underlying layer, is formed on the barrier layer.

Initially, the barrier layer and lower conductive layer are formed in the contact hole and on the dielectric layer.

In accordance with the embodiments of FIG. 9 and FIGS. 10A-10E, after the lower conductive layer is formed to have a good step coverage in the contact hole, a CMP or etch-back process is carried out to remove a portion of the lower conductive layer having a relatively poor surface morphology outside the contact hole region, thereby forming a plug. An upper conductive layer for an interconnection stripe is formed on exposed portions of the barrier layer and on the contact plug.

Figure 12:
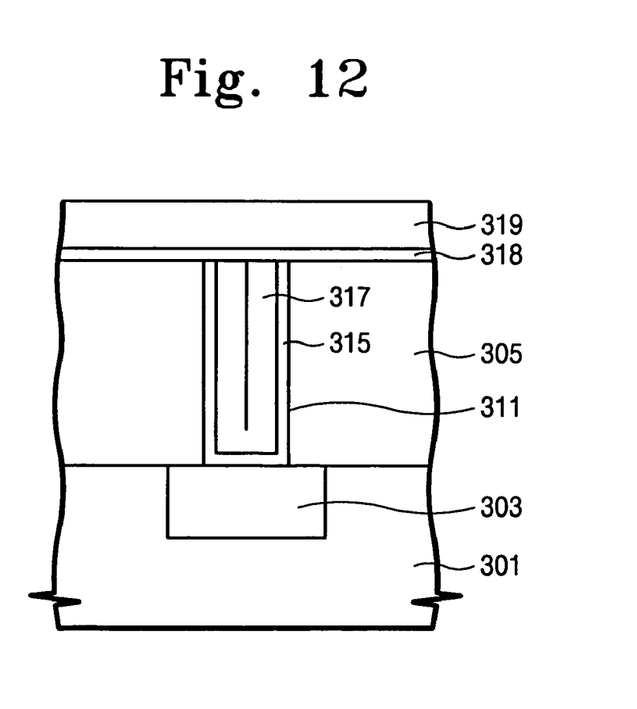

In accordance with the embodiment of FIG. 12, after the lower conductive layer is formed to have a good step coverage in the contact hole, a portion of the barrier layer and a portion of the lower conductive layer having a relatively rough surface are removed outside the contact hole to expose the dielectric layer and the plug. After exposing the dielectric layer and the plug, an additional barrier layer is formed thereon. After forming the additional barrier layer, an upper conductive layer is formed on the additional barrier layer.

Accordingly, the upper conductive layer can be formed to have a relatively good surface morphology, with a smaller grain size as compared to that of the lower conductive layer (plug), because a portion of it that is not formed on the contact plug is formed on the barrier layer. The barrier layer provides a surface morphology such that the upper conductive layer is formed thereon with a relatively low degree of surface roughness. In this manner, after formation of the contact plug with good step coverage, an interconnection stripe having a good surface morphology is formed on the barrier layer.

Figure 11:
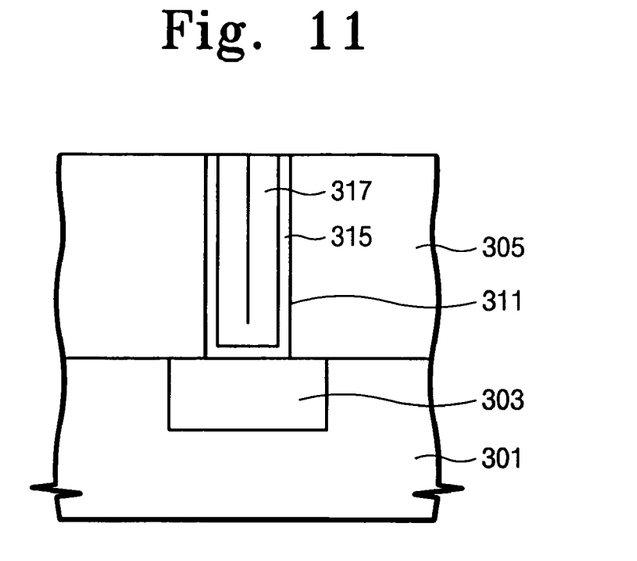
FIGS. 11 and 12 are cross sectional schematic views illustrating a process for forming an electrical interconnection according to a second embodiment of the present invention.

FIGS. 11 and 12 are cross sectional schematic views illustrating a process for forming an electrical interconnection according to a second embodiment of the present invention.

Referring to FIG. 11, a substrate 301, a conductive area 303, a dielectric layer 305, a contact hole 311, a barrier layer 315 and a lower conductive layer 317 are provided using same method as that of the first embodiment.

The lower conductive layer 317 and the barrier layer 315 are polished using CMP (chemical mechanical polishing) to expose a surface of the dielectric layer 305 and leave a tungsten plug filling the contact hole.

Referring to FIG. 12, a second barrier layer 318 is deposited over the dielectric layer 305 and the tungsten plug. The second barrier layer 318 preferably is formed of one selected from the group consisting of titanium, titanium nitride, tungsten silicide and combinations thereof. In this embodiment, the second barrier layer 318 is formed of titanium nitride. This second barrier layer 318 is deposited by sputtering or CVD to a thickness of between about 100 to 500 Angstroms.

Subsequently, an upper conductive layer 319 is deposited over the second barrier layer 318 using the same method as the first embodiment. Though not shown, the combination of the upper conductive layer 319 and the second barrier layer is patterned using a conventional photo/etching process, thereby leaving an interconnecting stripe over the dielectric layer.

It has been determined that grain size of the upper conductive layer is smaller than that of the lower conductive layer, and that the smaller the grain size is, the smoother the surface of CVD tungsten film.

According to the present invention, the lower conductive layer having the property of rough surface and good step coverage is removed except for the portion that lies in the contact hole such that the contact hole is be completely filled by the lower conductive layer without void. Furthermore, the interconnecting stripe does not comprise the lower conductive layer having the property of rough surface and high tensile stress. Therefore, the present invention resolves the residue problem and the alignment adjustment problem discussed above in connection with the conventional methods.

While the invention has been particularly shown and described with reference to preferred embodiments thereof, it will be understood by those skilled in the art that various changes in form and details may be made without departing from the spirit and scope of the invention.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method for fabricating a semiconductor device comprising:
    forming a dielectric layer over a substrate;
    forming a contact hole in the dielectric layer;
    forming a barrier layer in the contact hole and on a surface of the dielectric layer;
    forming a lower conductive layer on the barrier layer to fill the contact hole;
wherein the lower conductive layer is formed using a mixture of reactive gases comprising a first source gas and a first reduction gas;
    removing a portion of the lower conductive layer outside the contact hole to leave a plug in the contact hole; and
    forming an upper conductive layer on the barrier layer and on the plug, wherein the upper conductive layer is formed using a mixture of reactive gases comprising a second source gas identical to the first source gas and a second reduction gas identical to the first reduction gas, wherein a flow rate of the first source gas is greater than a flow rate of the second source gas, and wherein the first and second reduction gases include hydrogen and $SiH_4$, each having a flow rate greater than 0 sccm, the hydrogen flow rate of the first reduction gas used to form the lower conductive layer being the same as the hydrogen flow rate of the second reduction gas used to form the upper conductive layer, and the $SiH_4$ flow rate of the first reduction gas used to form the lower conductive layer being greater than the $SiH_4$ flow rate of the second reduction gas used to form the upper conductive layer.

2. The method of claim 1, wherein removing a portion of the lower conductive layer outside the contact hole is carried out by a process selected from the group consisting of an etch back process and a polishing process.

3. The method of claim 1, wherein the barrier layer is formed of a material selected from the group consisting of titanium, titanium nitride, tungsten silicide and combination thereof.

4. The method of claim 1, wherein the lower conductive and upper conductive layers are formed of tungsten film.

5. The method of claim 1, wherein the lower conductive layer is formed by CVD and the upper conductive layer is formed by sputtering.

6. The method of claim 1, wherein the lower conductive layer and the upper conductive layer are formed by CVD.

7. The method of claim 1, wherein the lower conductive layer has a larger grain size than the upper conductive layer.

* * * * *